(12) United States Patent
Chan et al.

(10) Patent No.: US 11,610,980 B2
(45) Date of Patent: Mar. 21, 2023

(54) METHOD FOR PROCESSING A FINFET DEVICE

(71) Applicant: IMEC VZW, Leuven (BE)

(72) Inventors: Boon Teik Chan, Wilsele (BE); Changyong Xiao, Leuven (BE); Jie Chen, Leuven (BE)

(73) Assignee: IMEC VZW, Leuven (BE)

( * ) Notice: Subject to any disclaimer, the term of this patent is extended or adjusted under 35 U.S.C. 154(b) by 106 days.

(21) Appl. No.: 17/210,110

(22) Filed: Mar. 23, 2021

(65) Prior Publication Data
US 2021/0305412 A1    Sep. 30, 2021

(30) Foreign Application Priority Data

Mar. 24, 2020 (EP) ..................... 20165087

(51) Int. Cl.
| | | |
|---|---|---|
| H01L 29/66 | (2006.01) | |
| H01L 21/762 | (2006.01) | |
| H01L 29/06 | (2006.01) | |
| H01L 29/40 | (2006.01) | |
| H01L 29/423 | (2006.01) | |

(52) U.S. Cl.
CPC .. *H01L 29/66795* (2013.01); *H01L 21/76224* (2013.01); *H01L 29/0665* (2013.01); *H01L 29/401* (2013.01); *H01L 29/42392* (2013.01)

(58) Field of Classification Search
CPC ............. H01L 29/785; H01L 29/78696; H01L 29/0673
See application file for complete search history.

(56) References Cited

U.S. PATENT DOCUMENTS

| | | |
|---|---|---|
| 10,312,152 B2 | 6/2019 | Rodder et al. |
| 10,381,438 B2 | 8/2019 | Zhang et al. |
| 10,418,449 B2 | 9/2019 | Paul et al. |
| 2011/0045648 A1 | 2/2011 | Knorr et al. |
| 2018/0114728 A1 | 4/2018 | Xiao |
| 2018/0211866 A1 | 7/2018 | Cheng et al. |
| 2019/0074224 A1 | 3/2019 | Xie et al. |

(Continued)

OTHER PUBLICATIONS

Extended European Search Report and Written Opinion, EP Application No. 20165087.6, dated Sep. 23, 2020, pp. 1-11.

(Continued)

*Primary Examiner* — Changhyun Yi
(74) *Attorney, Agent, or Firm* — McDonnell Boehnen Hulbert & Berghoff LLP

(57) ABSTRACT

A method for processing a forksheet device includes providing a substrate and forming a trench in the substrate, extending along a first direction, in the substrate. The formation of the trench includes forming a grating structure on the substrate that includes a pair of maskings, arranged at a distance from each other, and etching the trench into the substrate in a region between the pair of maskings. The method also includes filling the trench with a filling material and partially recessing the substrate to form a fin structure. This fin structure includes the filled trench, a first section of the substrate at a first side of the filled trench and a second section of the substrate at a second side of the filled trench, and forming a gate structure on and around the fin structure. The method additionally includes forming a gate structure on and around the fin structure.

19 Claims, 6 Drawing Sheets

(56) References Cited

U.S. PATENT DOCUMENTS

| | | |
|---|---|---|
| 2019/0172828 A1 | 6/2019 | Smith et al. |
| 2020/0006487 A1 | 1/2020 | Guha et al. |
| 2020/0020540 A1 | 1/2020 | Cheng et al. |
| 2021/0210489 A1* | 7/2021 | Zhang .............. H01L 27/0924 |

OTHER PUBLICATIONS

Weckx, P., J. Ryckaert, E. Dentoni Litta, D. Yakimets, P. Matagne, P. Schuddinck, D. Jang et al. "Novel forksheet device architecture as ultimate logic scaling device towards 2nm." In 2019 IEEE International Electron Devices Meeting (IEDM), pp. 36-5. IEEE, 2019.

Tao, Z., L. Zhang, E. Dupuy, B. T. Chan, E. Altamirano-Sanchez, and F. Lazzarino. "FEOL dry etch process challenges of ultimate FinFET scaling and next generation device architectures beyond N3." In Advanced Etch Technology for Nanopatterning IX, vol. 11329, p. 113290O. International Society for Optics and Photonics, 2020.

Kanhaiya, Pritpal S., Gage Hills, Dimitri A. Antoniadis, and Max M. Shulaker. "DISC-FETs: Dual independent stacked channel field-effect transistors." IEEE Electron Device Letters 39, No. 8 (2018): 1250-1253.

Anju, Eisuke, Iriya Muneta, Kuniyuki Kakushima, Kazuo Tsutsui, and Hitoshi Wakabayashi. "Relaxation of self-heating-effect for stacked-nanowire FET and p/n-stacked 6T-SRAM layout." IEEE Journal of the Electron Devices Society 6 (2018): 1239-1245.

Loubet, N., T. Hook, P. Montanini, C-W. Yeung, S. Kanakasabapathy, M. Guillorn, T. Yamashita et al. "Stacked nanosheet gate-all-around transistor to enable scaling beyond FinFET." In 2017 Symposium on VLSI Technology, pp. T230-T231. IEEE, 2017.

Dash, T. P., S. Dey, E. Mohapatra, S. Das, J. Jena, and C. K. Maiti. "Vertically-stacked silicon nanosheet field effect transistors at 3nm technology nodes." In 2019 Devices for Integrated Circuit (DevIC), pp. 99-103. IEEE, 2019.

\* cited by examiner

METHOD FOR PROCESSING A FINFET DEVICE

CROSS-REFERENCE TO RELATED APPLICATIONS

The present application is a non-provisional patent application claiming priority to European Patent Application No. 20165087.6, filed Mar. 24, 2020, the contents of which are hereby incorporated by reference.

FIELD OF THE DISCLOSURE

The present disclosure relates to a method for processing a FinFET device, and in particular, a forksheet device, and further relates to a FinFET device obtainable by said method.

BACKGROUND

A fin field-effect transistor (FinFET) is a type of metal-oxide semiconductor field effect transistor (MOSFET) with a fin shaped channel between the source and drain terminals. Thereby, the gate is placed on two or three sides of the fin shaped channel, and in some cases, surrounds the channel. Compared to a conventional planar MOSFET, such as a CMOS, a FinFET allows for faster switching times and higher current densities.

A forksheet (FSH) device is a special type of FinFET, where the fin shaped channel comprises a plurality of vertically stacked nanosheets. The fin shaped channel of a forksheet device further comprises a pMOS and an nMOS side, which are separated by a dielectric isolation in the center of the fin. By using such a forksheet design, the switching times of a FinFET device can be increased, while a power consumption of the device can be reduced.

However, it is difficult to fabricate FinFETs and forksheet devices. In particular, current fabrication processes do not allow controlling critical dimensions such as the height of the fin structure and the height of the dielectric isolation within the fin structure independently. This leads to strong limitations in the FinFET and Forksheet designs.

SUMMARY

Thus, aspects of the application provide an improved method for processing a FinFET device, and in particular a forksheet device, and to provide an improved FinFET device obtainable by the method. These aspects are achieved by the solutions elucidated by the claims.

A first aspect of the present disclosure relates to a method for processing a FinFET device, and in an example, a forksheet device. The method comprises:
  providing a substrate;
  forming a trench in the substrate, wherein the trench extends along a first direction;
  filling the trench with a filling material;
  partially recessing the substrate to form a fin structure, wherein the fin structure comprises the filled trench, a first section of the substrate at a first side of the filled trench and a second section of the substrate at a second side of the filled trench; and
  forming a gate structure on and around the fin structure.

This facilitates efficient processing of the FinFET device with high process control.

In particular, by forming the trench and recessing the substrate in two separate and decoupled process steps, the depth of the trench and the height of the fin structure, which comprises the trench, can be controlled independently from another. In contrast, forming the trench and the fin structure simultaneously would make the trench depth dependent on the fin height.

In addition, by forming the trench and recessing the substrate in two separate and decoupled process steps, effects such as micro-loading and intra-cell fin loading, i.e., local variations in the etch rate, can be decreased. These local variations are caused, for instance, by a difference between a trench width and a fin-to-fin distance when forming trench and fin structure simultaneously. By eliminating these effects, straighter wall profiles of the trench and better critical dimension control of the fin structure and trench can be achieved.

Filling the trench prior to forming the fin structure facilitates protecting the inner walls of the trench by the filling material when forming the fin structure.

The FinFET device can be a nanosheet device, and in an example, a nanosheet FET, or a forksheet device, and in an example, a forksheet FET (FSH FET).

The fin structure can form a channel of the FinFET. In an example, the fin structure is arranged between a source and a drain terminal of the FinFET.

An embodiment further comprises:
  forming a p-doped region on or in the first section of the substrate and/or forming an n-doped region on or in the second section of the substrate. In an example, the formed region(s) follow the formation of the fin structure.

This facilitates efficient processing of a FinFET having a p-gate and an n-gate.

Alternatively, the n-doped region can be formed on or in the first section and/or the p-doped region can be formed on or in the second section.

In an example, the fin structure forms a channel, wherein the first section defines a p-gate contact and the second section defines an n-gate contact of the channel, or vice versa. In an example, the FinFET device is a multigate device, wherein the gate structure of the FinFET comprises a p-gate and an n-gate.

In an embodiment, the p-doped and/or the n-doped regions are formed via an epitaxy growth process. In an example, this is performed during an epitaxial formation of source and drain terminals.

This facilitates efficient doping of the first and second sections. In an example, this is performed during source and drain formation.

For example, the p-doped region can be formed by deposing SiGe:B (SiGe with Boron doping) and Ga, and the n-doped region can be formed by deposing SiP (silicon with phosphor doping) and As. In an example, the deposition is formed on the first respectively second section of the fin structure.

In an embodiment, forming the trench in the substrate comprises:
  forming a grating structure on the substrate, wherein the grating structure comprises a pair of maskings extending along the first direction, wherein the pair of maskings are arranged at a distance from each other; and
  etching into the substrate in a region between the pair of maskings to form the trench.

This facilitates efficiently forming the trench with high precision.

In an example, the grating structure comprises a hard mask on the substrate.

The etching between the pair of maskings can comprise a wet etching process and/or a dry etching process, such as a reactive ion etching process.

In an embodiment, forming the trench in the substrate further comprises:

forming, following the forming of the grating structure, a sacrificial structure on the substrate and on and around the grating structure, wherein the sacrificial structure comprises at least one material layer; and selectively removing the sacrificial structure in a region between the pair of maskings.

This facilitates efficiently forming the trench with high precision.

In an embodiment, a spacer layer is formed at least partially around the pair of maskings, and in an example, on facing sidewalls of each of the pair of maskings.

This facilitates efficiently forming the trench with high precision. In an example, the spacer layer enhances a critical dimension (CD) control of the trench, e.g., the diameter of the trench formed in the substrate between the maskings can be further reduced by applying the spacer layer to the facing sidewalls of the maskings. In an example, the facing sidewalls refer to the inner sidewalls of the maskings on the side of each masking where the trench is formed.

In an embodiment, the spacer layer is formed prior to the forming of the sacrificial structure or following the selective removal of the sacrificial structure in the region between the pair of maskings.

This facilitates efficiently forming the trench with high precision. In an example, forming the spacer layer prior to or following selective removal of the sacrificial structure provides a further critical dimension (CD) control of the trench and/or the fin structure.

In an embodiment, the fin structure is formed by recessing, and in an example, etching the substrate at a distance from each side of the filled trench.

This facilitates efficiently forming the fin structure. The etching can comprise a wet or a dry etching process.

In an embodiment, the distance from each side of the filled trench is defined by a width of the masking on the respective side of the trench.

This facilitates efficiently forming the fin structure with high precision.

In an example, the fin structure is fully self-aligned to the maskings, which can form a hardmask grating. The maskings facilitate a critical dimension (CD) control of the fin structure.

In an embodiment, a difference between a depth of the trench and a height of the fin structure is less than 10%, and in an example, less than 5%, or less than 2%, or wherein the depth of the trench essentially corresponds to the height of the fin structure.

This facilitates processing the FinFET device with high process control over the design parameters. In an example, by forming the trench and recessing the substrate in two separate and decoupled process steps, the depth of the trench and the height of the fin structure can be tuned independently, for instance, to be essentially identical.

In an embodiment, the depth of the trench is larger than or equal to the height of the fin structure.

This facilitates processing the FinFET device with high process control over the design parameters. In an example, local variations in the etch rate that would occur when forming the trench and the fin structure simultaneously can be prevented. These local variations would, for instance, be caused by a difference between a trench-width to a fin-to-fin distance and would typically lead to the trench depth being smaller than the fin structure height.

In another embodiment, the depth of the trench is smaller than the height of the fin structure. In an example, the trench depth and the fin height can be controlled independently from another.

In an embodiment, the filling material comprises a dielectric material, and in an example, silicon nitride (SiN), silicon carbide (SiC), silicon oxycarbonitride (SiOCN), silicon carbonitride (SiCN), silicon dioxide ($SiO_2$), silicon carbon oxide (SiCO), or silicon oxynitride (SiON).

In an example, the filled trench forms a dielectric isolation barrier of the fin structure.

In an embodiment, the trench is filled via a plasma-enhanced atomic layer deposition, PEALD, process.

This facilities efficient filling of the trenched with high process control.

Alternatively, the trench can be filed by a low temperature (LT) SiN deposition and/or a flowable chemical vapor deposition (FCVD) of SiC.

In an embodiment, the substrate comprises a nanosheet structure of alternating nanolayers of two different semiconductor materials, in particular Si and SiGe, wherein the trench passes through the nanosheet structure.

This facilitates efficient processing of a fin structure that comprises the alternating nanolayers, such as a forksheet structure. In an example, when partially recessing the substrate to form the fin structure, the first and second sections of the substrate, which form opposite sides of the fin structure, each comprise the nanosheet structure.

According to a second aspect, the present disclosure relates to a FinFET device, and in an example, a forksheet device, obtainable by the method according to the first aspect, and in an example where a difference between a depth of the trench and a height of the fin structure is less than 10%, less than 5%, less than 2%, or where the depth of the trench essentially corresponds to the height of the fin structure.

This facilitates providing a FinFET device that is processed efficiently and with high process control.

Such a FinFET device produced with the method of the first aspect shows clear "fingerprints" of that method. By forming the trench and recessing the substrate in two separate and decoupled process steps, the depth of the trench and the height of the fin structure, which comprises the trench, can be controlled independently from another; and in an example, the trench depth can be larger or essentially identical to the fin height. In contrast, forming the trench and the fin structure simultaneously in a joint process step, e.g., an etching step, would make the trench depth dependent on the fin height, wherein typically the trench depth would be less than the fin height, e.g., due to so called micro-loading effects.

BRIEF DESCRIPTION OF THE FIGURES

The above, as well as additional, features will be better understood through the following illustrative and non-limiting detailed description of example embodiments, with reference to the appended drawings.

FIGS. 1A-1I show steps of a method for processing a FinFET device according to an embodiment.

All the figures are schematic, not necessarily to scale, and generally only show parts that are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

FIGS. 1A-1I show steps of a method for processing a FinFET device according to an embodiment, such as the main steps for forming the fin structure of a forksheet device are illustrated.

Figure 1A:
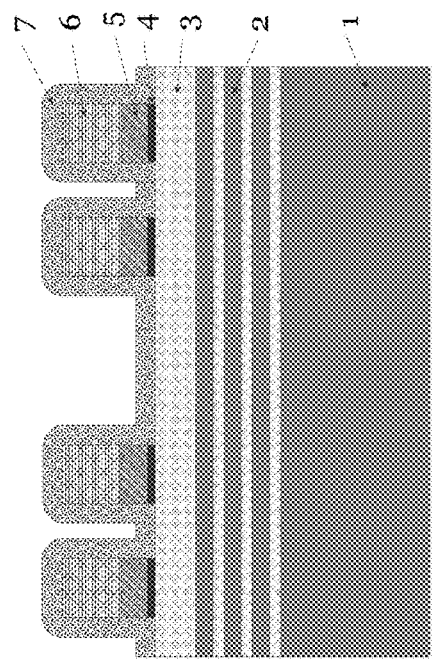

The method comprises, as shown in FIG. 1A, providing a substrate 21.

The substrate 21 can comprise a base structure 1, e.g., composed of Si, and a nanosheet structure of alternating nanolayers 2, 3 arranged on the base structure 1. The alternating nanolayers can comprise Si layers 2 and SiGe layers 3. For example, the Si layers 2 have a thickness of 10 nm and the SiGe layers 3 have a thickness of 7 nm when arranged between two Si layers 2. The upper SiGe layer 3 can form a top layer of the substrate 21 and can have a larger thickness of, e.g., 30 nm. The SiGe layers 3 can comprise 30% Germanium (Ge).

The method further comprises, as shown in FIG. 1A, forming a grating structure on the substrate 21, wherein the grating structure comprises a pair of maskings 23 extending along a first direction, here along the x-direction. The pair of maskings 23 are arranged at a first distance from each other. The x-direction is perpendicular to the z-direction, wherein the z-direction is in-line with the direction of layer fabrication, and the x-direction is also perpendicular to the y-direction, as indicated by the schematic coordinate system. The x-direction extends into the plane of FIGS. 1A-1I.

In the example embodiment of FIG. 1A, two pairs of maskings 23 on the substrate 21 are shown, wherein each of the pair of maskings 23 defines where a fin structure will be formed. For the sake of clarity, in the following, the method is explained with reference to one of the pairs of maskings 23 and the fin structure generated by means of this pair of maskings 23. The same applies to the second pair.

In an example, each of the pairs of maskings 23 comprises a bottom layer 4, a mid-layer 5 and a top layer 6. The bottom layer 4 can be made of $SiO_2$, the mid-layer 5 can be made of $Si_3N_4$ (silicon nitride), and the top layer 6 can be made of SiC, SiCO, or $SiO_2$.

In an example, the grating structure forms a hardmask (HM) on the substrate 21. The grating structure can be formed by a deposition of the layer 4, 5, 6 materials on the substrate 21 followed by a photolithographic structuring of said layers 4, 5, 6.

Figure 1B:
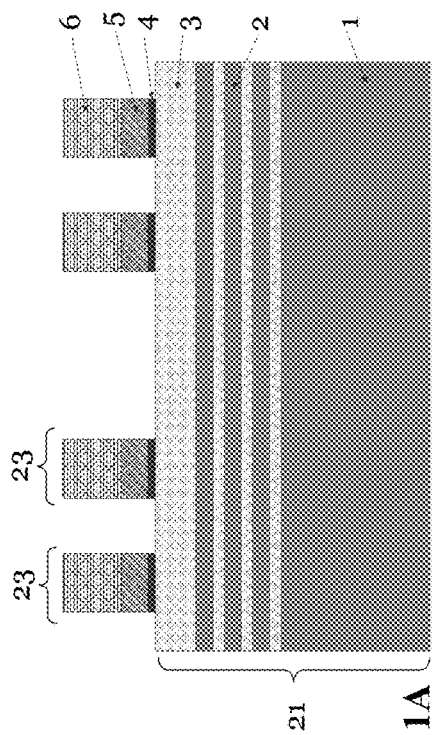

As shown in FIG. 1B, the method further comprises forming a spacer layer 7 on the substrate 21 and around the pair of maskings 23, and in an example, the spacer layer 7 is also formed on facing sidewalls of the pair of maskings 23.

The spacer layer can be formed by a deposition process, such as plasma-enhanced atomic layer deposition (PEALD), and can comprise $Si_3N_4$ and/or $SiO_2$.

Figure 1C:
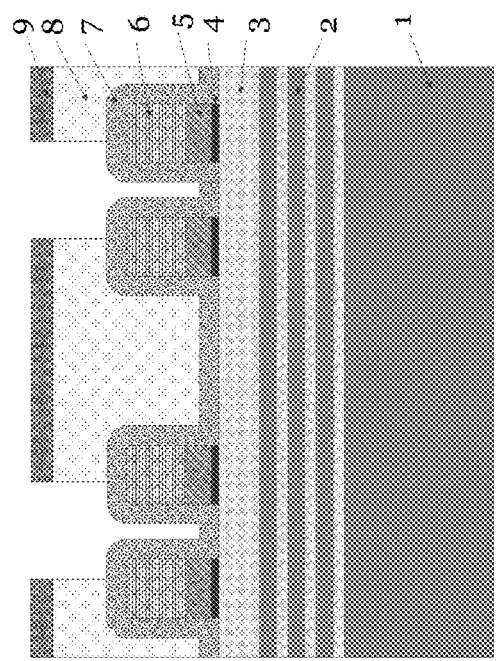

As shown in FIG. 1C, the method further comprises forming a sacrificial structure on the substrate 21 and on and around the grating structure. The sacrificial structure comprises at least one material layer 8, 9, 10.

In FIG. 1C, the sacrificial structure comprises three material layers 8, 9, 10, namely a spin-on carbon (SoC) layer 8, a spin-on-glass (SoG) layer 9, and a photoresist (PR) layer 10. The PR layer 10 can be opened in regions above the pair of maskings 23, and in an example, via selective illumination of the PR layer 10 through a photolithographic mask, followed by development and removal steps.

Figure 1D:
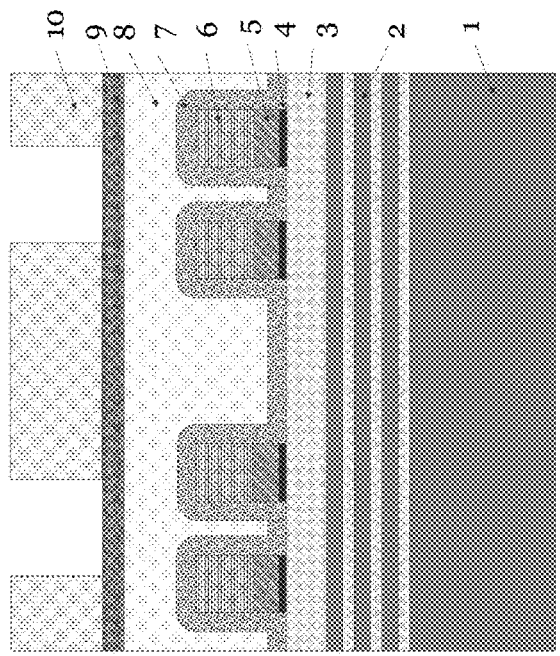

As shown in FIG. 1D, the method further comprises a selective removal, i.e., opening, of the sacrificial structure, and in an example of the SoC and SoG layers 8, 9 in a region between the pair of maskings 23.

The selective removal can be achieved by etching the SoC and SoG layers 8, 9 below the openings of the PR layer 8. In an example, the SoC and SoG layers 8, 9 are etched by a dry etching step that selectively removes the SoC and SoG material but leaves the PR layer 9 mostly intact.

Figure 1E:
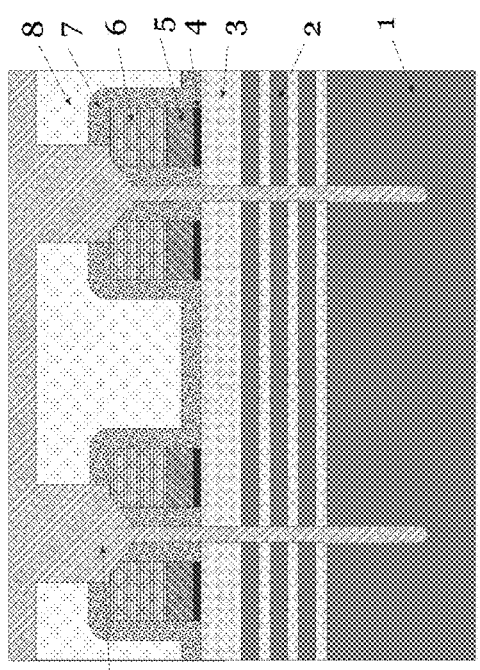

As shown in FIG. 1E, the method further comprises forming a trench 25 in the substrate 21, wherein the trench extends along the x-direction.

The trench 25 can be formed by etching into the substrate 21 in a region between the pair of maskings 23, e.g., by an isotropic etching process such as reactive ion etching. For example, the trench 25 has a width of 8 nm.

Figure 1F:
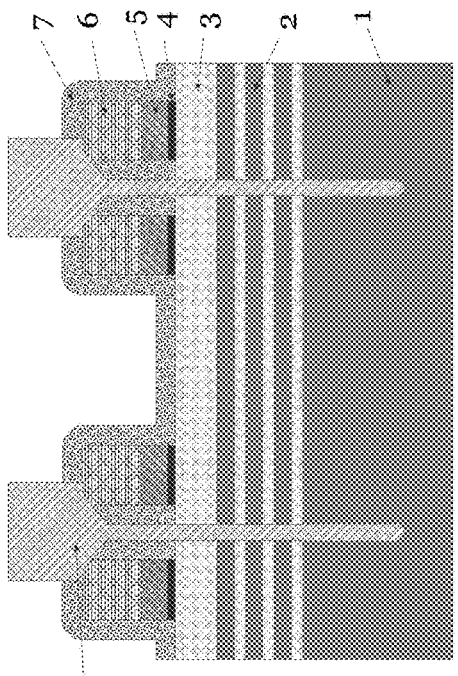

As shown in FIG. 1F, the method further comprises filling the trench 25 with a filling material 11.

The filling material 11 can be a dielectric material that will form a dielectric isolation barrier of the fin structure.

The trench 25 can be filled via a plasma-enhanced atomic layer deposition, PEALD, process. Alternatively, the trench 25 can be filed by a low temperature (LT) SiN deposition and/or a flowable chemical vapor deposition (FCVD) of SiC.

Filling the trench 25 prior to forming the fin structure (c.f. FIG. 1I) facilitates protecting the inner walls of the trench 25 by the filling material 11 when recessing the substrate to form the fin structure.

Figure 1G:
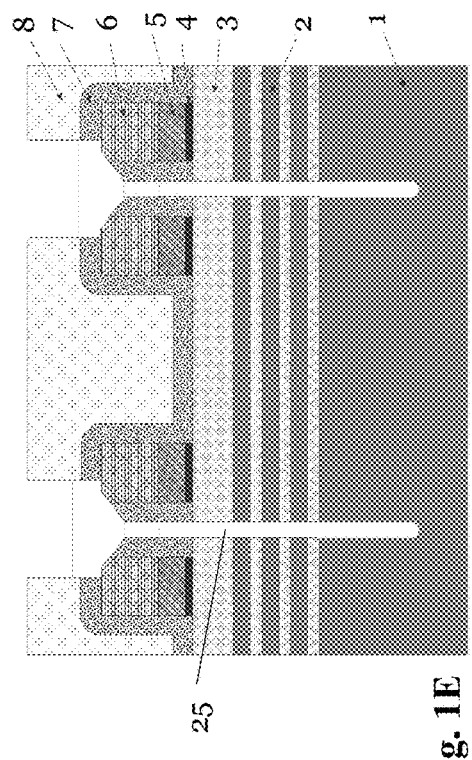

As shown in FIG. 1G, the method further comprises recessing the trench filling material. The filling material can be recessed by an etch back or by a chemical-mechanical polishing (CMP).

Figure 1H:
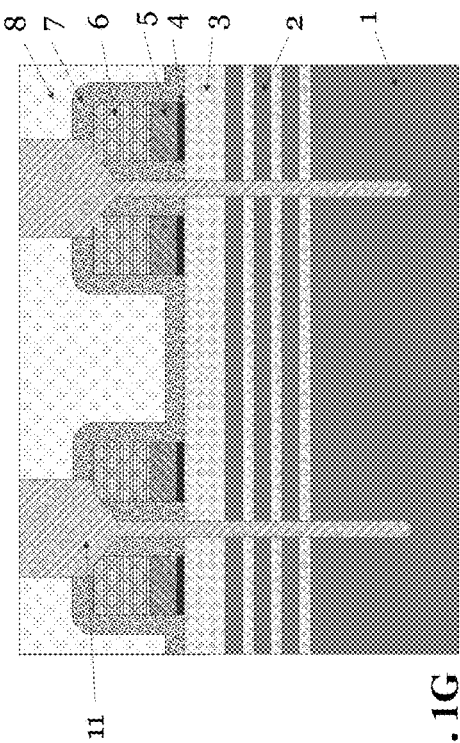
Figure 11:
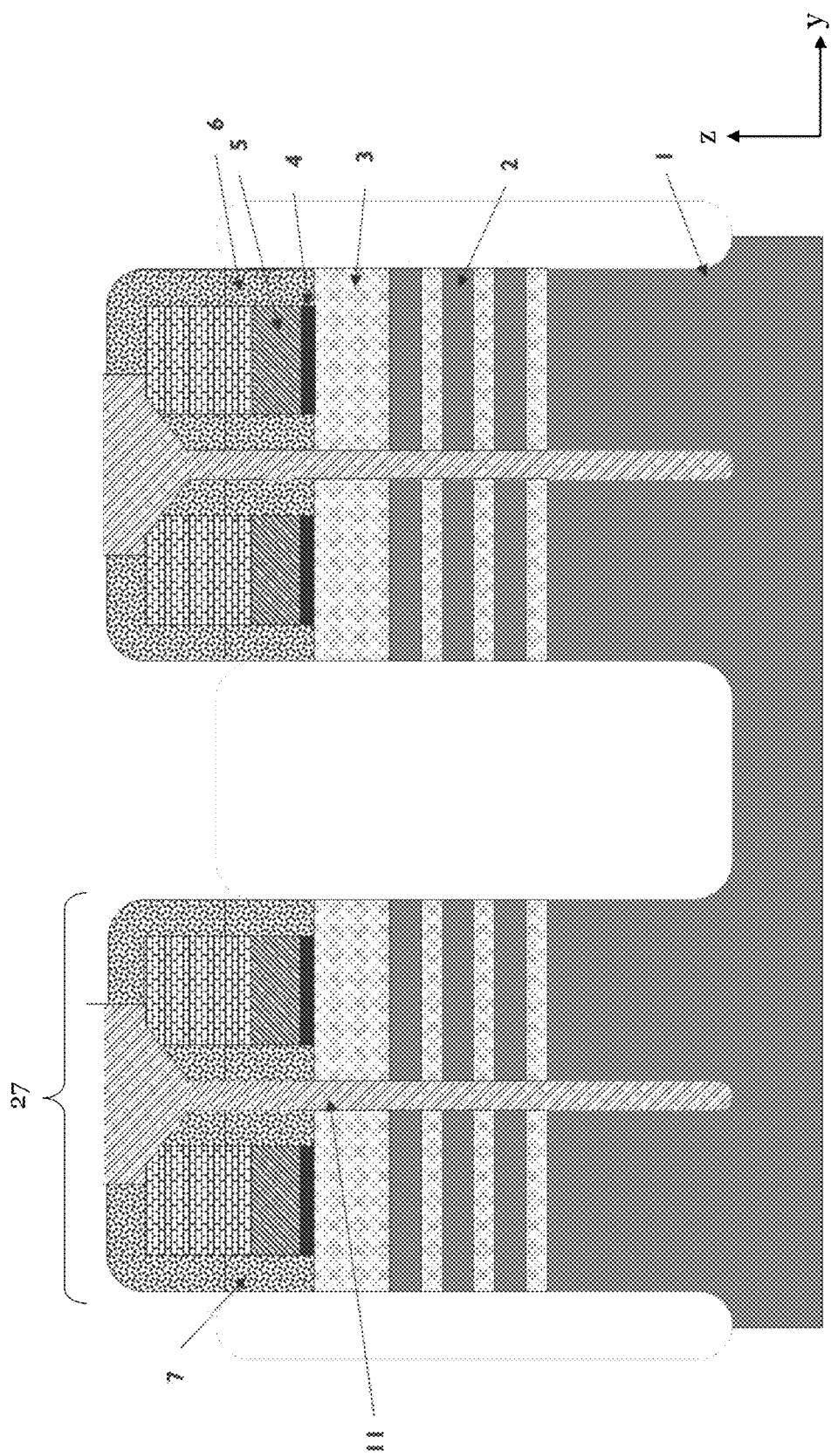

In an example, the method further comprises removal of the remnants of the sacrificial structure, as shown in FIG. 1H. In an example, the removal of the sacrificial structure comprises a stripping of the SoC layer. 8

As shown in FIG. 1I, the method comprises partially recessing the substrate 21 to form a fin structure 27.

The fin structure 27 can comprise the filled trench 25, a first section of the substrate at a first side of the filled trench 25 and a second section of the substrate at a second side of the filled trench 25.

The fin structure 27 can be formed by recessing the substrate at a distance from each side of the filled trench 25, and in an example, the distance at each side is defined by a width of the respective masking 23 of the pair of maskings 23 and in an example of the thickness of the spacer layer 7 around the maskings 23. The fin structure can be self-aligned to the maskings 23, which can form a hardmask grating. The masking can enhance a critical dimension (CD) control of the fin structure 27.

In an example, recessing the substrate to form the fin structure 2 can be realized via a suitable dry or a wet etching process, in an example via an isotropic etch-back process. During or after the recess, excess filling material 11 that protrudes from the pair of maskings 23 can be removed.

Forming and filling the trench 25 prior to forming the fin structure 27 makes it possible to control the design of the trench 25, and in an example, its depth, independently from the height of the fin structure 27. For instance, the difference between the depth of the trench 25 and the height of the fin structure 27 can be set to be less than 10%, 5%, 2%, or even 1%. In an example, the respective process steps can be tuned in such a way that the height of the fin structure 27 after recess essentially corresponds to the depth of the trench 25. The depth of the trench 25 can also be set to be larger than the height of the fin structure 27 such that the filled trench below the fin structure 27 extends further into the substrate 21. In contrast, when the trench 25 and the fin structure 27 would be formed simultaneously, the trench 25 depth would typically be less than the fin height, in particular due to local variations in the etch rate. These local variations would, for instance, be caused by a difference between a trench width to a fin-to-fin distance. This limitation can be overcome by forming the trench and fin structure in separate steps.

Following formation of the fin structure 27, a p-doped region can be formed on the fin, and in an example, on or in the first section of the substrate 21. Likewise, an n-doped region can be formed on the fin, and in an example, on or in the second section of the substrate 21.

The p-doped and/or the n-doped regions can be formed by means of an epitaxy growth process, and in an example, during an epitaxial formation of source and drain terminals. For example, the p-doped region can be formed by deposing SiGe:B (SiGe with Boron doping) and Ga, and the n-doped region can be formed by deposing SiP (silicon with phosphor doping) and As.

In an example, the method further comprises forming a gate structure on and around the fin structure 27.

The gate structure can comprise a p-gate in contact with a p-doped region of the fin structure 27 and an n-gate in contact with an n-doped region of the fin structure 27.

FIGS. 2A-2J shows steps of a method for processing a FinFET device according to a further embodiment.

The method as shown in FIGS. 2A-2J differs from the method as shown in FIGS. 1A-1I mainly by the order of applying the spacer layer 7 and the sacrificial structure.

Figure 2A:
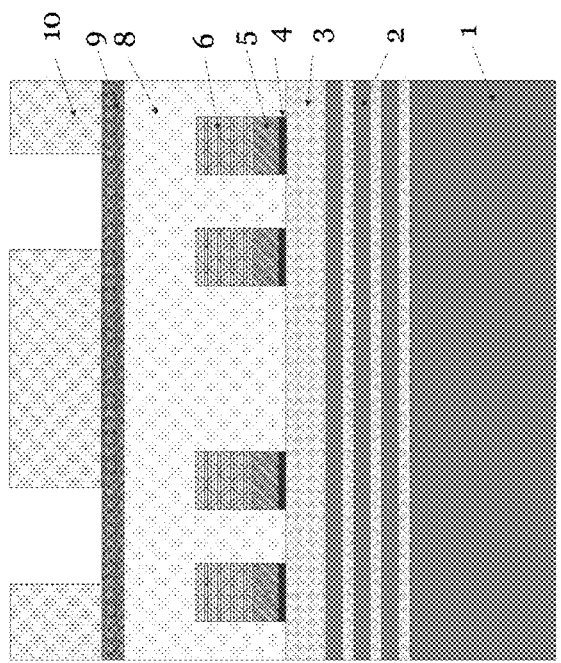
FIGS. 2A-2J show steps of a method for processing a FinFET device according to an embodiment.

The method comprises, as shown in FIG. 2A, providing the substrate 21, which comprises the base structure 1, e.g., composed of Si, and the nanosheet structure of alternating nanolayers 2, 3 arranged on the base structure 1. The substrate 21 comprises the grating structure. In an example, the substrate 21 and the grating structure shown in FIG. 2A, are identical to the substrate 21 and the grating structure shown in FIG. 1A.

Figure 2B:
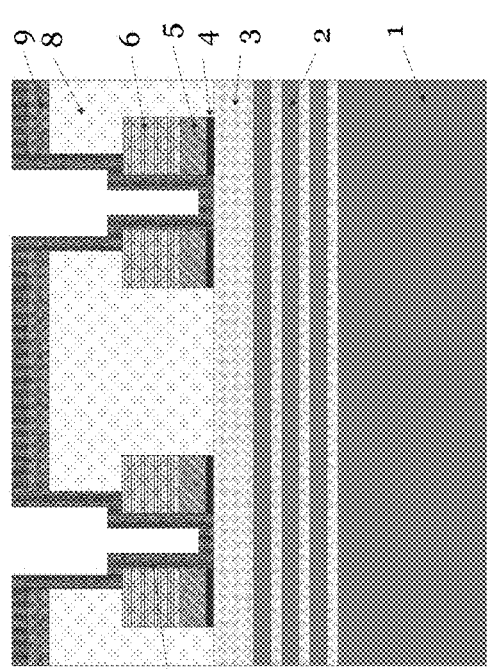

As shown in FIG. 2B, the method comprises forming the sacrificial structure directly on the substrate 21 and on and around the grating structure. The sacrificial structure can again comprise the three material layers 8, 9, 10, wherein the PR layer 10 can be opened in regions above the pair of maskings 23.

The sacrificial structure may further comprise an amorphous silicon (a-Si) layer. In an example, the a-Si layer can replace the SoC layer 8.

Figure 2C:
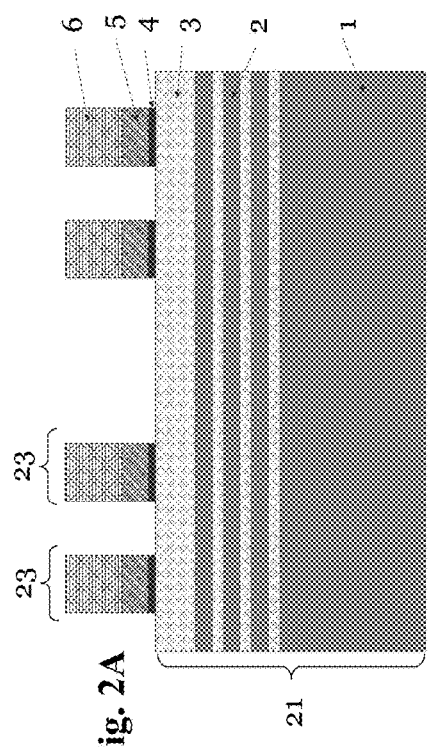

The method further comprises the selective removal of the sacrificial structure, and in an example of the SoC and SoG layers 8, 9 in a region between the pair of maskings 23, as shown in FIG. 2C.

Figure 2D:
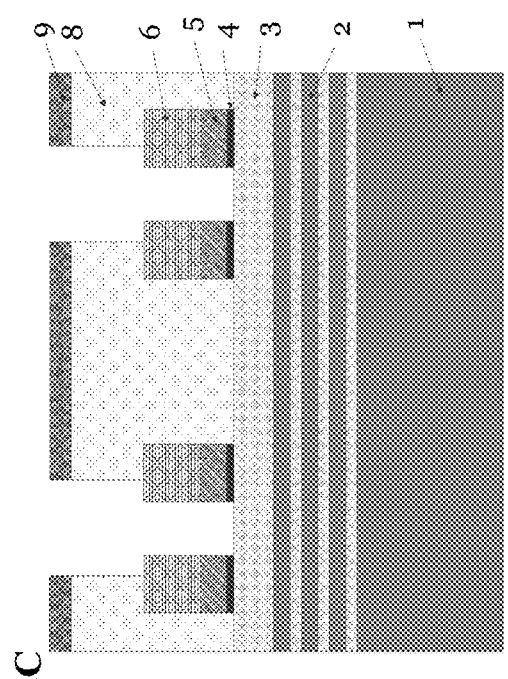

In a subsequent step, which is shown in FIG. 2D, the spacer layer 12 is formed on top of the remaining sacrificial structure as well as the pair of maskings 23 and the substrate in between the pair of maskings 23. In an example, the spacer layer 7 is also formed on facing sidewalls of the maskings 23.

The spacer layer 12 can be a $SiO_2$ or a $Si_3N_4$ layer. In an example, the formation of the spacer layer 12 comprises a low temperature oxide formation.

Figure 2E:
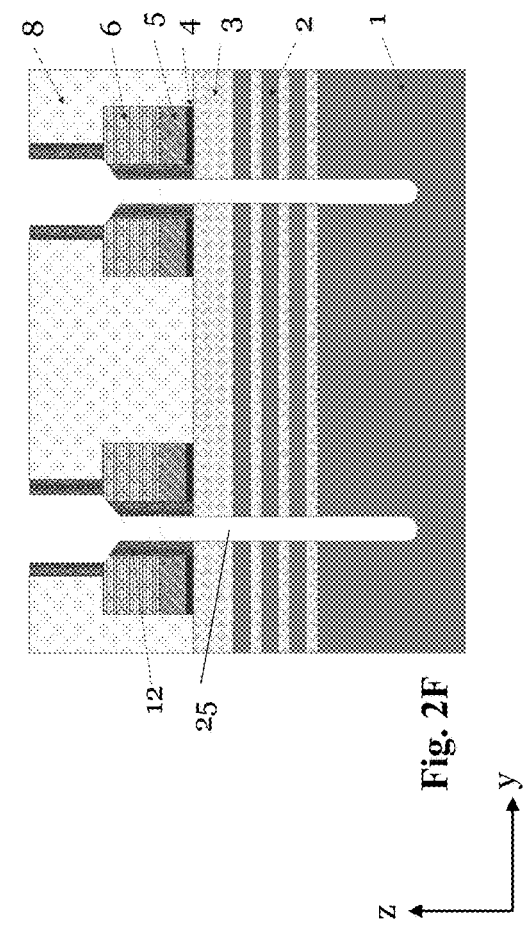

As shown in FIG. 2E, the method further comprises selective removal of the spacer layer 12, e.g., by etching. In an example, the spacer layer 12 only remains intact at the facing sidewalls of the maskings 23 and/or facing sidewalls of the sacrificial structure on top of the maskings.

The remaining spacer layer 12 on the facing sidewalls of the maskings 23, can facilitate formation of the trench 25 between the maskings with critical dimensions, e.g., with a diameter smaller than the distance of the maskings 23. In other words, the remaining spacer layer 12 facilitates reducing the gap between the pair of the maskings 23 and, thus, the width of the trench 25 formed between the pair of maskings 23.

Figure 2F:
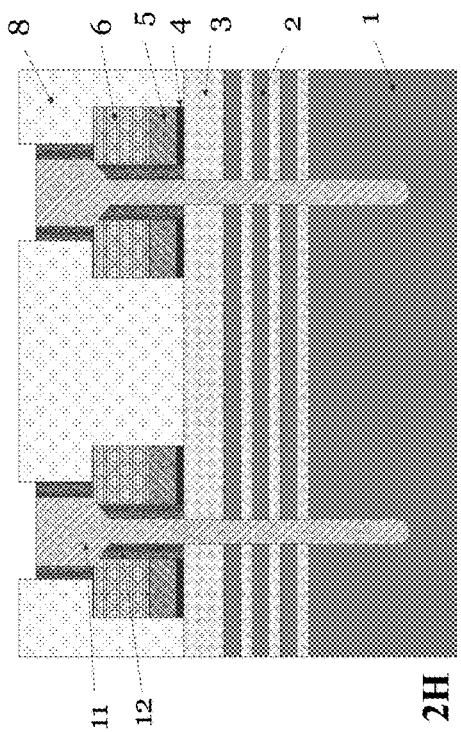
Figure 2G:
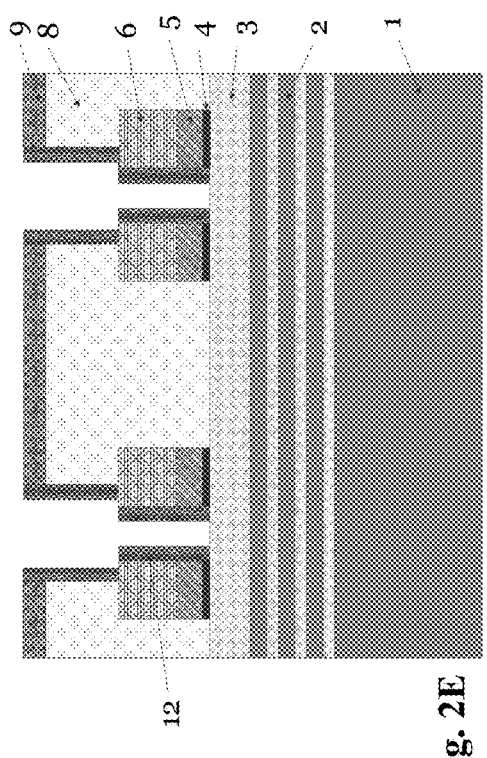

As shown in FIGS. 2F-2G, the method further comprises forming the trench 25 and filling said trench 25 with the filling material, and in an example with the same processes as described above for FIGS. 1E-1F.

Figure 2H:
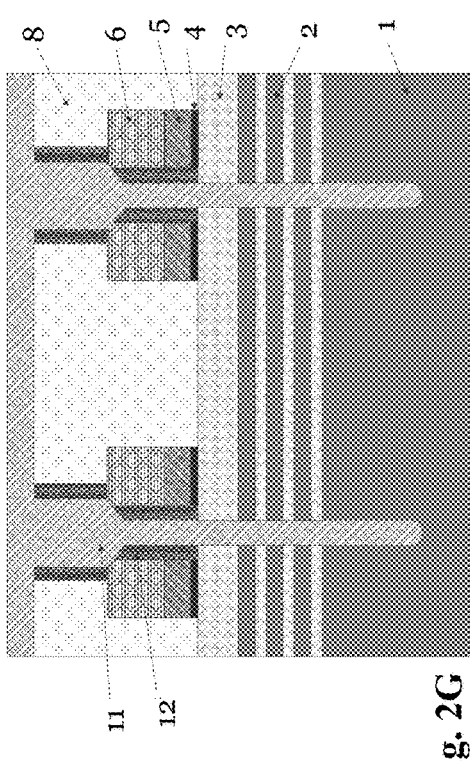

The method can further comprise, as shown in FIG. 2H, recessing the trench filling material 11. The filling material can be recessed by an isotropic dry etching process.

Figures 2I, 2J:
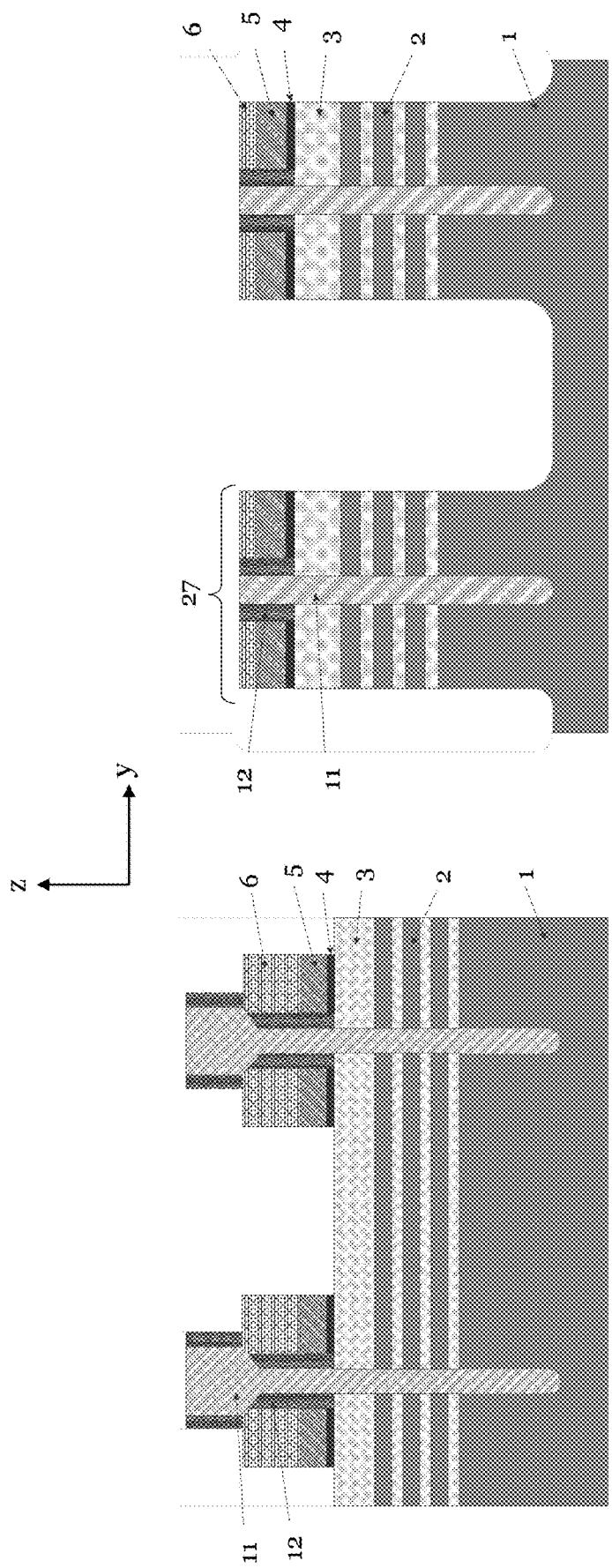

As shown in FIGS. 2I-2J, the method further comprises removing the remnants of the sacrificial structure and partially recessing the substrate 21 to form the fin structure 27, and in an example with the same processes as described above for FIGS. 1h-i.

In an example, the method further comprises forming the gate structure on and around the fin structure 27.

In the method, as shown in FIGS. 2A-2J, again the formation of the trench 25 is decoupled from the formation of the fin structure 27. Thus, the depth of the trench can be controlled independently from the height of the fin structure 27. In an example, the trench 25 depth can be larger or essentially identical to the fin structure 27 height.

When using the same grating structure as a starting point, the method steps shown in FIGS. 1A-1I may result in different critical dimensions, and in an example, a different width of the resulting fin structures 27 than the method steps shown in FIGS. 2A-2J. The critical dimension of each fin structure 27 depends on the critical dimensions of the respective pair of maskings 23, and in an example, the width of each masking 23, their distance in the y-direction, and on the spacer layer 7 on the side walls of the maskings 23, which increase the effective width of the maskings 23. In the method shown in FIGS. 1A-1I, the spacer layer 7 is arranged on facing and averted side walls of the maskings 23 (c.f. FIG. 1I), wherein in the method shown in FIGS. 2A-2J, the spacer layer 12 is only arranged on facing side walls of the maskings 23 (c.f. FIG. 2J). Thus, a fin structure 27 formed by the method shown in FIGS. 1A-1I has a width in y-direction which is increased by two times the thickness of the spacer layer 7 compared to the width of a fin structure formed by the method shown in FIGS. 2A-2J. The spacer layers 7, 12 on the facing sidewalls of the maskings 23 reduce the effective distance of the maskings and, thus, the diameter of the trench 25 in the y-direction. Thus, forming the spacer layers 7, 12 prior to or following selective removal of the sacrificial structure provides a further critical dimension (CD) control of the trench 25 and/or the fin structure 27.

The fin structure 27 formed with the method shown in FIGS. 1A-1I or in FIGS. 2A-2J can be a channel of the FinFET device. In an example, the FinFET device is a forksheet (FSH) device. The method can comprise further steps, such as forming source and drain terminals that are connected by the fin structure or forming a connection to the gate structure.

The substrate 21 can be a wafer, and in an example, a Si wafer that comprises the nanosheet structure.

All features of all embodiments described, shown, and/or claimed herein can be combined with each other.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A method for processing a forksheet device, the method comprising:
    providing a substrate, wherein the substrate comprises a nanosheet structure of alternating nanolayers of two different semiconductor materials that comprise Si and SiGe;
    forming a trench in the substrate, wherein the trench extends along a first direction, and wherein the trench passes through the nanosheet structure, wherein forming the trench in the substrate comprises:
        forming a grating structure on the substrate, wherein the grating structure comprises a pair of maskings extending along the first direction, wherein the pair of maskings are arranged at a distance from each other; and
        etching into the substrate in a region between the pair of maskings to form the trench;
    filling the trench with a filling material;
    partially recessing the substrate to form a fin structure, wherein the fin structure comprises the filled trench, a first section of the substrate at a first side of the filled trench and a second section of the substrate at a second side of the filled trench, wherein the first and the second section of the substrate form opposite sides of the fin structure and each comprise a part of the nanosheet structure, and wherein the filled trench forms a dielectric isolation barrier of the fin structure; and
    forming a gate structure on and around the fin structure.

2. The method according to claim 1, wherein the method further comprises:
    forming a p-doped region on or in the first section of the substrate or forming an n-doped region on or in the second section of the substrate following the formation of the fin structure.

3. The method according to claim 2, wherein the p-doped or the n-doped regions are formed via an epitaxy growth process during an epitaxial formation of source and drain terminals.

4. The method according to claim 1, wherein a spacer layer is formed at least partially around the pair of maskings on facing sidewalls of each of the pair of maskings.

5. The method according to claim 1, wherein forming the trench in the substrate further comprises:
    forming, following the forming of the grating structure, a sacrificial structure on the substrate and on and around the grating structure, wherein the sacrificial structure comprises at least one material layer; and
    selectively removing the sacrificial structure in a region between the pair of maskings.

6. The method according to claim 5, wherein a spacer layer is formed at least partially around the pair of maskings on facing sidewalls of each of the pair of maskings.

7. The method according to claim 6, wherein the spacer layer is formed prior to the forming of the sacrificial structure or following the selective removal of the sacrificial structure in the region between the pair of maskings.

8. The method according to claim 7, wherein the distance from each side of the filled trench is defined by a respective inner sidewall of a respective masking of the pair of maskings on the respective side of the trench.

9. The method according to claim 8, wherein the fin structure is formed by etching the substrate at a distance from each side of the filled trench.

10. The method according to claim 1, wherein the fin structure is formed by etching the substrate at a distance from each side of the filled trench.

11. The method according to claim 10, wherein the distance from each side of the filled trench is defined by a respective inner sidewall of a respective masking of the pair of maskings on the respective side of the trench.

12. The method according to claim 1, wherein a difference between a depth of the trench and a height of the fin structure is less than 10%.

13. A forksheet device formed using a method that comprises the method according to claim 12.

14. The method according to claim 1, wherein a difference between a depth of the trench and a height of the fin structure is less than 5%.

15. The method according to claim 1, wherein a depth of the trench corresponds to a height of the fin structure.

16. A forksheet device formed using a method that comprises the method according to claim 15.

17. The method according to claim 1, wherein a depth of the trench is larger than or equal to a height of the fin structure.

18. The method according to claim 1, wherein the filling material comprises a dielectric material selected from one or more of: SiN, SiC, SiOCN, SiCN, $SiO_2$, SiCO, or SiON.

19. The method according to claim 1, wherein the trench is filled via a plasma-enhanced atomic layer deposition, PEALD, process.

* * * * *